United States Patent [19]
Suzuki et al.

[11] Patent Number: 5,205,903
[45] Date of Patent: Apr. 27, 1993

[54] PRODUCTION OF HONEYCOMB STRUCTURE-EXTENDING DIES

[75] Inventors: Kazuo Suzuki, Inazawa; Kenji Arai, Nagoya; Masayuki Matsuzaki, Inaba, all of Japan

[73] Assignee: NGK Insulators, Ltd., Japan

[21] Appl. No.: 818,538

[22] Filed: Jan. 9, 1992

[30] Foreign Application Priority Data

Jan. 14, 1991 [JP] Japan .................................. 3-14832

[51] Int. Cl.$^5$ .......................... B44C 1/22; C23F 1/00; B05D 3/04; C23C 16/00
[52] U.S. Cl. .................................... 156/646; 156/645; 156/656; 156/664; 156/345; 427/237; 427/238; 427/248.1; 427/309
[58] Field of Search ................ 156/644, 646, 656, 664, 156/645, 345; 252/79.1, 79.2, 79.4; 427/237, 238, 248.1, 252, 309, 255; 118/715, 719, 50

[56] References Cited

U.S. PATENT DOCUMENTS 4,324,594 4/1982 Chasteen ................................. 134/2
5,070,588 12/1991 Mina et al. ........................ 427/237 X

FOREIGN PATENT DOCUMENTS 3431892 3/1986 Fed. Rep. of Germany .
1062284 3/1967 United Kingdom .

OTHER PUBLICATIONS

Patent Abstracts of Japan, vol. 9, No. 125 (C-283)(1848) May 30, 1985 JP-A-60 013 073 (Hinode Kinzoku Netsuren KK) Jan. 23, 1985.

Primary Examiner—William A. Powell
Attorney, Agent, or Firm—Parkhurst, Wendel & Rossi

[57] ABSTRACT

A process for producing a honeycomb structure-extruding die by etching a surface of a base material for a honeycomb structure-extruding die with a gas, and coating the etched base material by CVD before an oxidized film is formed after the etching.

7 Claims, 3 Drawing Sheets

FIG_2
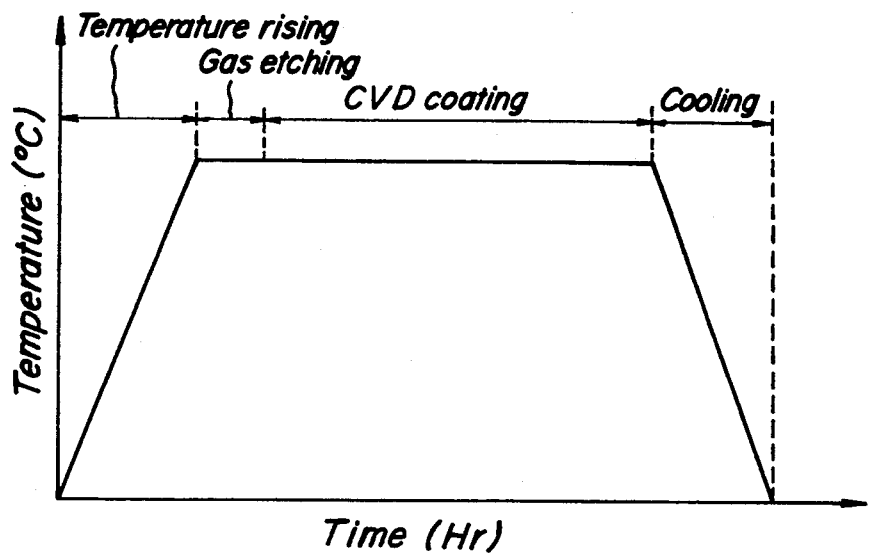
FIG_3
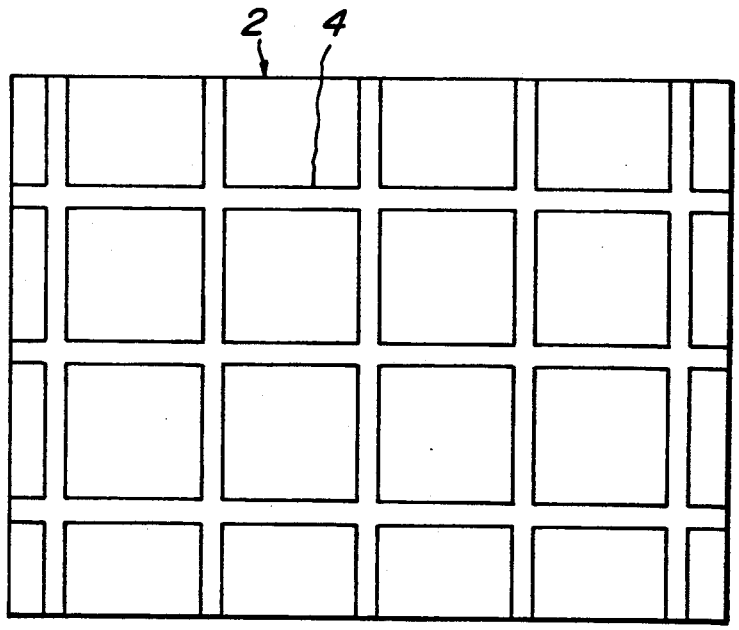

PRODUCTION OF HONEYCOMB STRUCTURE-EXTENDING DIES

BACKGROUND OF THE INVENTION

Field of the Invention

The present invention relates to a process for producing a honeycomb structure-extruding die having excellent wear resistance by coating a surface of a base material made of stainless steel through a CVD technique. The base material is adapted to be used for the die and the CVD technique is preferably carried out at a medium temperature.

It is known from, for example, Japanese patent application Laid-open No. 60-145,805 (extruding die and production method thereof, Corning glass works) that wear resistance of a honeycomb structure-extruding die is improved by treating a surface of a base material for the die using a CVD process.

It is also disclosed, for example, in Japanese patent application Laid-open No. 61-69,968 (steel matrix, producing process thereof, Berna AG Olten) to utilize the CVD process for a homeycomb structure-extruding die base material made of stainless steel.

However, when the die base material is to be coated by the CVD process, it is indispensable to remove contaminants, a processed layer, an oxidized film, etc. from the base material to be coated, by fully washing the base material before the coating. If this step is not satisfactorily effected, a coating film is not formed or the coating formed is peeled during cooling. Thus, even if the coating film is formed, such a film has only a short life. Particularly, if the base material for the honeycomb structure-extruding die is stainless steel, it is likely that an oxidized film is formed on the surface and particular care needs to be made to peel the oxidized film. An acidic solution is usually used to remove such an oxidized film. However, this process suffers a problem that since the resulting die is rinsed with water to remove the acidic solution remaining on the surface after being washed with the acidic solution, and the die is dried in an oven or the like, an oxidized film is formed again during the drying, and a good coating film cannot be obtained by the CVD process.

The above peeling problem can be solved by ensuring a relatively long cooling time after the coating by the CVD process. However, if the cooling time is made longer, the total coating time by the CVD process increases, resulting an increased cost in producing the die. On the other hand, if a material, which is required to be hardened, is coated by the CVD, the coated material needs be quenched after the coating, so that it is substantially impossible to prolong the cooling time.

SUMMARY OF THE INVENTION

It is an object of the present invention to solve the above-mentioned problems of the prior art, and to provide a process for producing a honeycomb structure-extruding die in which a coating film having good adhesion and excellent wear resistance is formed on a base material of the die by a CVD process.

The present invention has been accomplished to realize the above-mentioned object, and is characterized by the process for producing a honeycomb structure-extruding die, which process includes the steps of etching a surface of a base material for a honeycomb structure-extruding die with a gas, and immediately thereafter, coating the etched base material by CVD. The term "immediately thereafter" means that the CVD-coated film is formed, before an oxidized film is formed after the etching.

That is, in order to realize the above-mentioned object, according to the present invention, the step of etching the die base material with a gas, for example, with hydrogen chloride gas generated by reacting titanium tetrachloride with hydrogen is introduced before the CVD coating. By so doing, the oxidized film on the surface of the die base material is removed, and good CVD coating film is formed However, the gas etching gas is not limited to these materials. For example, etching may be effected by using hydrogen chloride phosphoric acid gas or hydrogen fluoride gas.

When hydrogen chloride gas itself is used as the etching gas, a corrosion-resistive feed pipe line needs to be employed which is more expensive. On the other hand, it is preferable to use hydrogen chloride gas generated by reacting titanium tetrachloride with hydrogen in an etching chamber, because such a corrosion-resistive feed pipe line is unnecessary.

The gas etching is preferably effected in a temperature range from 700°–900° C. This temperature range is preferred from the standpoint of preventing deformation of the base material for the die and effecting sufficient etching with the gas.

The gas etching is preferably effected for a period of time from 0.5 to 3.5 hours. If the etching time is shorter than 0.5 hour, sufficient etching can not be obtained, the coating film becomes non-uniform, or the coating film is likely to peel during the cooling step. On the other hand, if the etching time is longer than 3.5 hours, the die base material is corroded to form a brittle layer on its surface so that the coating film having wear resistance cannot be obtained.

The base material for the honeycomb structure-extruding die may be a stainless steel. Since stainless steel to be used for the base material for the honeycomb-extruding die is very sensitive to oxygen and water, it is preferable to effect the etching with the gas in a reducing atmosphere. If oxygen or water is contained in the atmosphere, it is feared that sufficient etching cannot be exhibited so that the coating film becomes non-uniform or peels during the cooling step.

Further, the gas etching is preferably effected inside a CVD coating apparatus. The gas etching according to the present invention is preferably effected immediately before the coating by the CVD process starts, or the etching is preferably effected as one step in a CVD coating schedule. That is, after the die base material is set inside the CVD coating apparatus, a reducing gas is flowed through the CVD coating device, and the temperature is raised to a given level. Then, the substrate is etched with gas, and the CVD coating is subsequently effected. When the gas etching and the CVD coating are effected continuously in such as closed state, it is possible to completely prevent re-attachment of contaminant to the surface of the die base material and re-formation of an oxidized film. Thus, a the uniform coating film having excellent adhesion can be obtained.

These and other objects, features and advantages of the invention will be appreciated upon reading of the description of the preferred embodiment of the invention when taken in conjunction with the attached drawings, with the understanding that some modifications, variations and changes of the invention could be made by the skilled in the art to which the invention pertains without departing from the spirit of the invention nor the scope of claims appended hereto.

BRIEF DESCRIPTION OF THE DRAWINGS

For a better understanding of the invention, reference is made to the attached drawings, wherein:

FIG. 2 is a schematic view illustrating a treating process in Example 1;

FIG. 3 is an enlarged view of a honeycomb structure-extruding die obtained by a process in Example 1;

DESCRIPTION OF PREFERRED EMBODIMENTS

The present invention will be explained in more detail based on preferred embodiments of the present invention with reference to the attached drawings.

Example 1

A die base material was prepared from PSL (Commercial name) (martensitic precipitation hardened stainless steel manufactured by Hitachi Metal, Co., Ltd). The base material had an elliptical shape with a major axis of 215 mm, a minor axis of 130 mm and a thickness of 21 mm. In this base material, holes L having a diameter of 1.5 mm were bored from one side surface by drilling or electrolytic working, and then shaping channels having a width of about 200 μm were formed by discharging from the other side opposite to the side from which the above holes were bored. The resulting base material was dewaxed with an alkali, washed with water, and further supersonically washed by using an acidic solution, followed by washing with water again.

Figure 1:
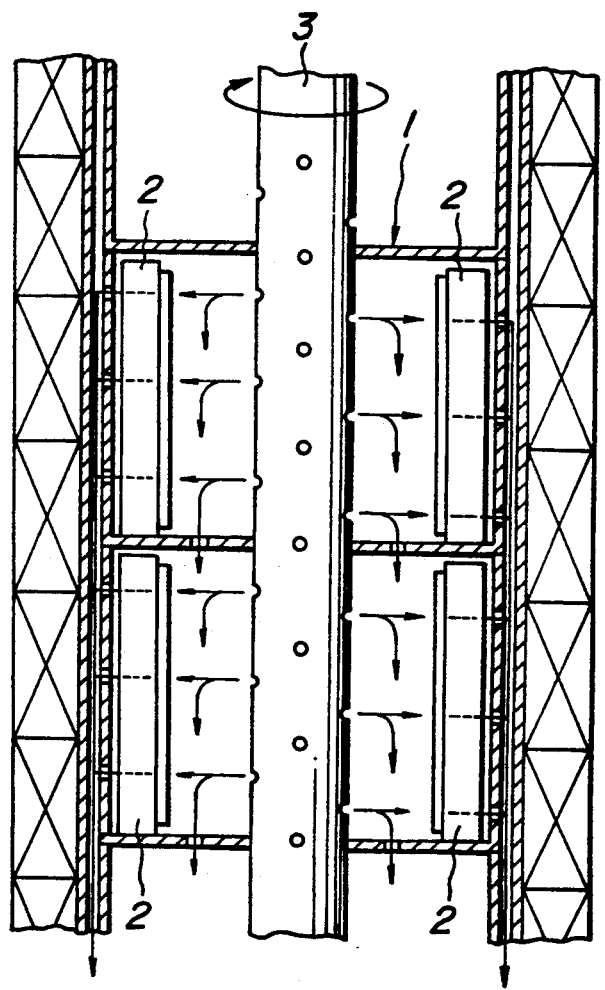
FIG. 1 is a sectional view of a CVD coating apparatus used in Examples of the present invention.

Then, four such die base materials 2 were set inside a standard type CVD coating apparatus manufactured by Bernex Div. having an outer diameter of 275 mm and a height of 750 mm as schematically shown in FIG. 1. After a chamber was closed, the interior of a chamber was evacuated. While hydrogen gas was flowed through a gas feed nozzle 3 at the center, the temperature was raised up to 770° C. under reduced pressure. Then, titanium tetrachloride gas was led into the chamber through the gas feed nozzle 3, and the base material was etched for 3 hours with a hydrogen chloride gas which was being generated by reacting hydrogen gas with the titanium tetrachloride gas. Thereafter, hydrogen, titanium tetrachloride and acetonitrile gas were flowed into the CVD coating apparatus through the gas feed nozzle 3, and CVD coating was effected with Ti(C, N) (titanium carbonitride) at 770° C. for 10 hours. At that time, the die base material 2 was so arranged that the shaping channels in the base material might be directed toward the gas feed nozzle, and the flow rate of the total material gas was 27.0 liters/min. and the pressure was 60 mbar. The above process is schematically shown in FIG. 2. Results were checked by a microscope at a magnification of 20-30 times. In this Example, as shown in FIG. 3, honeycomb structure-extruding dies having a Ti(C,N) coating film 4 on the surface of the die base material 2 in a thickness of 15 μm was obtained, the coating film being uniform and free from peeling was obtained.

Example 2

Figure 4:
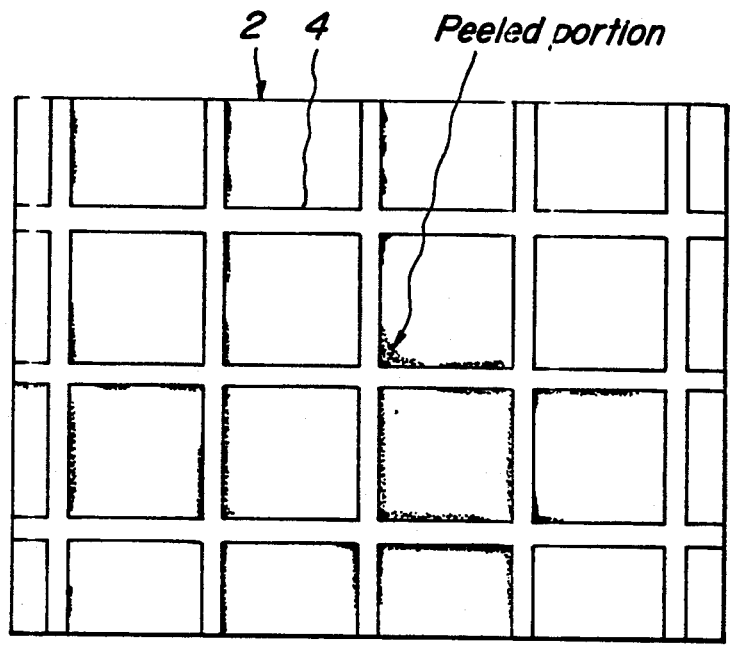
FIG. 4 is an enlarged view of a honeycomb structure-extruding die obtained by a process in Example 2.

A die base material having the same material and the same shape as those in Example 1 was prepared, washed and then placed in the CVD coating apparatus 1 in the same manner. The conditions in Example 2 were the same as in Example 1 except that the etching time period was changed to 0.5 hour. As a result, it was revealed that a Ti(C,N) coating film 4 was formed on the surface of the die base material 2 in a thickness of 15 μm. However, as shown in FIG. 4, the coating film 4 was partially peeled, and adhesion of the coating film 4 was slightly inferior to that of the coating film in Example 1. The resulting die having undergone such a partial peeling could be used without any practical problem.

Comparative Example

Figure 5:
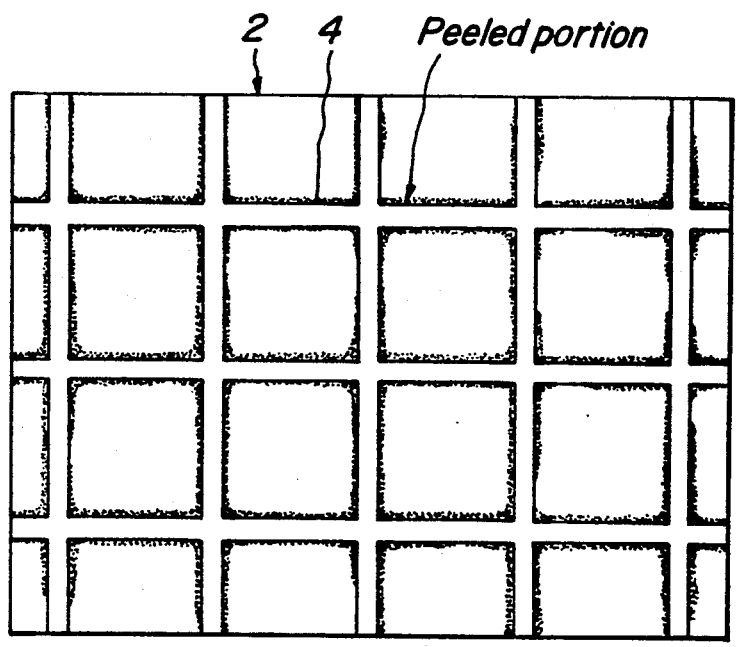
FIG. 5 is an enlarged view of a honeycomb structure-extruding die obtained by a process in Example 3.

A die base material having the same material and the same shape as those in Example 1 was prepared, washed and placed in the CVD coating apparatus 1 in the same manner, except that a CVD coating was effected immediately after raising the temperature, without effecting the gas etching in this Comparative Example. The conditions other than this were all the same as those in Example 1. As a result, it was revealed that a Ti(C,N) coating film 4 was formed on the surface of the die base material 2 in a thickness of 15 μm. However, as shown in FIG. 5, the coating film 4 was peeled over its entirety, and the coating film 4 having good adhesion could not be obtained.

As mentioned above, according to the present invention, since the die base material is etched with the gas, preferably inside the CVD apparatus, before the base material is coated by the CVD, a coating film possessing excellent adhesion and being free from peeling can be formed on the surface of the die. Since the peeling of the coating film can be prevented like etching the base material with the gas, the die can be quenched to shorten the time required for the coating, and the production cost of the die can be reduced. Therefore, the present invention solves the problems possessed by the prior art, and greatly contributes to the industrial development as a process for producing honeycomb structure-extruding dies.

What is claimed is:

1. A process for producing a honeycomb structure-extruding die, said process including the steps of:
    etching a surface of a base material for a honeycomb structure-extruding die with a gas; and
    coating the etched base material by CVD before an oxidized film is formed on the etched base material after the etching.

2. The process of claim 1, wherein the etching is effected for a period of time from 0.5 to 3.5 hours.

3. The process of claim 1, wherein the etching is effected at 700°-900° C.

4. The process of claim 1, wherein the base material for the honeycomb structure-extruding die is made of a stainless steel.

5. The process of claim 1, wherein the etching is effected inside a CVD coating apparatus.

6. The process of claim 1, wherein the etching is effected with hydrogen chloride gas generated by reacting hydrogen with titanium tetrachloride.

7. The process of claim 1, wherein the etching is effected in a reducing atmosphere.

* * * * *